(12) United States Patent
Huang (10) Patent No.: US 10,827,632 B2
(45) Date of Patent: Nov. 3, 2020

(54) MIDDLE FRAME ASSEMBLY, ELECTRONIC APPARATUS AND METHOD FOR MANUFACTURING MIDDLE FRAME ASSEMBLY

(71) Applicant: GUANGDONG OPPO MOBILE TELECOMMUNICATIONS CORP., LTD., Dongguan, Guangdong (CN)

(72) Inventor: Fuyong Huang, Dongguan (CN)

(73) Assignee: GUANGDONG OPPO MOBILE TELECOMMUNICATIONS CORP., LTD, Dongguan, Guangdong (CN)

( * ) Notice: Subject to any disclaimer, the term of this patent is extended or adjusted under 35 U.S.C. 154(b) by 0 days.

(21) Appl. No.: 16/201,269

(22) Filed: Nov. 27, 2018

(65) Prior Publication Data
US 2019/0246511 A1  Aug. 8, 2019

(30) Foreign Application Priority Data
Feb. 5, 2018 (CN) .......................... 2018 1 0112889

(51) Int. Cl.
*H05K 5/00* (2006.01)
*H05K 5/02* (2006.01)
(Continued)

(52) U.S. Cl.
CPC ............ *H05K 5/0217* (2013.01); *B23P 11/02* (2013.01); *H01Q 1/243* (2013.01); *H01Q 13/106* (2013.01);
(Continued)

(58) Field of Classification Search
None
See application file for complete search history.

(56) References Cited

U.S. PATENT DOCUMENTS 5,563,771 A * 10/1996 Bethurum ............ G06K 19/077
  257/679
6,728,112 B1 * 4/2004 Qin ..................... H04M 1/0277
  361/740
(Continued)

FOREIGN PATENT DOCUMENTS

CN   102608788 A   7/2012
CN   202795707 U   3/2013
(Continued)

OTHER PUBLICATIONS

Second Office Action and Search Report from China patent office in a counterpart Chinese patent Application 201810112889.0, dated Apr. 24, 2019 (11 pages).
(Continued)

*Primary Examiner* — Courtney L Smith
*Assistant Examiner* — Rashen E Morrison
(74) *Attorney, Agent, or Firm* — Ladas & Parry, LLP (57) ABSTRACT

A middle frame assembly may include a middle frame and a bearing plate, the middle frame may include a frame body having a first surface and a second surface opposite to the first surface, the frame body defines a first through hole penetrating the first surface and the second surface, the bearing plate may include a bearing body having a third surface and a fourth surface opposite to the third surface, and a first extending portion protruding from the third surface and configured to pass through the first through hole and fitting with the frame body, such that the bearing body may be connected to the frame body and that and that the first surface and the third surface may abut against each other.

15 Claims, 10 Drawing Sheets

(51) Int. Cl.
   *H01Q 1/24*   (2006.01)
   *H04M 1/02*   (2006.01)
   *H01Q 13/10*  (2006.01)
   *B23P 11/02*  (2006.01)

(52) U.S. Cl.
   CPC ....... *H04M 1/0202* (2013.01); *H04M 1/0277* (2013.01); *H05K 5/0017* (2013.01)

(56) References Cited

U.S. PATENT DOCUMENTS

| | | | |
|---|---|---|---|
| 6,894,739 B2 * | 5/2005 | Sung | G02F 1/133308 349/58 |
| 7,961,457 B2 * | 6/2011 | Huang | G02F 1/133308 349/58 |
| 8,073,510 B2 | 12/2011 | Min et al. | |
| 9,332,659 B2 * | 5/2016 | Tan | H05K 5/0008 |
| 9,468,126 B2 * | 10/2016 | Pronozuk | H05K 7/1488 |
| 9,933,822 B2 * | 4/2018 | Tan | H05K 5/0008 |
| 10,331,171 B2 * | 6/2019 | Seino | G06F 1/1637 |
| 2012/0120566 A1 * | 5/2012 | Miao | H04M 1/0249 361/679.01 |
| 2013/0031390 A1 * | 1/2013 | Smith, III | G06F 1/3293 713/320 |
| 2013/0141863 A1 * | 6/2013 | Ross | H05K 7/1489 361/679.33 |
| 2015/0020930 A1 | 1/2015 | Kamat et al. | |

FOREIGN PATENT DOCUMENTS

| | | |
|---|---|---|
| CN | 203664447 U | 6/2014 |
| CN | 204634209 U | 9/2015 |
| CN | 204887050 U | 12/2015 |
| CN | 105328327 A | 2/2016 |
| CN | 205071068 U | 3/2016 |
| CN | 106862399 A | 6/2017 |
| CN | 107087363 A | 8/2017 |
| CN | 206697154 U | 12/2017 |
| CN | 108188287 A | 6/2018 |
| CN | 108243587 A | 7/2018 |
| JP | 2000077854 A | 3/2000 |
| KR | 20170114889 A | 10/2017 |
| TW | 201103660 A1 | 2/2011 |
| WO | 2014024031 A1 | 2/2014 |

OTHER PUBLICATIONS

Hong Jiang, Solid Edge Basic tutorial, Aug. 2006, pp. 46, No. 1 (4 pages).
Third Office Action and Search Report from China patent office in a counterpart Chinese patent Application 201810112889.0, dated Jul. 3, 2019 (11 pages).
European search report and search opinion issued in EP18212550, dated Mar. 8, 2019 (7 pages).
International search report, PCT/CN2018/121566, dated Feb. 14, 2019 (5 pages).
Office Action and search report by the State Intellectual Property Office of People's Republic of China, No. 201810112889.0, dated Jan. 23, 2019 (8 pages).

* cited by examiner

FIG. 14

MIDDLE FRAME ASSEMBLY, ELECTRONIC APPARATUS AND METHOD FOR MANUFACTURING MIDDLE FRAME ASSEMBLY

CROSS REFERENCE TO RELATED APPLICATIONS

This application claims priorities to Chinese Patent Application No. 201810112889.0, filed on Feb. 5, 2018, the contents of which are herein incorporated by reference in their entireties.

TECHNICAL FIELD

The described embodiments relate to mechanical technology, and in particular to a middle frame assembly, an electronic apparatus with the middle frame assembly and a method for manufacturing the middle frame assembly.

BACKGROUND

Middle frame assembly generally includes a middle frame and a bearing plate. The middle frame includes a plurality of segmented frames arranged on an edge of the bearing plate. An antenna slot is defined between end faces of two adjacent segmented frames, and a clearance area communicating with the antenna slot is provided for the antenna radiating electromagnetic wave signals. The segmented frames and the bearing plate are fixed together by a rivet through riveting process, and each of the middle frame and the bearing plate needs to define a through hole for the rivet passing through. Therefore, space is required for containing the rivet.

BRIEF DESCRIPTION OF THE DRAWINGS

In order to make the technical solution described in the embodiments of the present disclosure more clear, the drawings used for the description of the embodiments will be briefly described. Apparently, the drawings described below are only for illustration but not for limitation. It should be understood that, one skilled in the art may acquire other drawings based on these drawings, without making any inventive work.

DETAILED DESCRIPTION

In order to more clearly understand the objective, the features and advantages of the present disclosure, the present disclosure will be described in details with reference to the drawings and the embodiments. It should be noted that, the embodiments and the features recited in the embodiments of the present disclosure may be combined with each other without confliction.

Plenty of specific details are described in the embodiments in order to better understand the technical solution of the present disclosure. However, the embodiments described here are only some exemplary embodiments, not all the embodiments. Based on the embodiments described in the present disclosure, one skilled in the art may acquire all other embodiments without any creative work. All these shall be covered within the protection scope of the present disclosure.

In the embodiments of the present disclosure, it is to be understood that terms such as "first" and "second" are used herein for purposes of description and are not intended to indicate or imply relative importance or significance or to imply the number of indicated technical features. Thus, the feature defined with "first" and "second" may comprise one or more of such a feature. In the description of the present disclosure, "a plurality of" means two or more than two, unless specified otherwise.

References throughout this specification to "an embodiment", "some embodiments", "one embodiment", "another example", "an example", "a specific example" or "some examples" mean that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in another example", "in an example", "in a specific example" or "in some examples" in various places throughout the specification are not necessarily referring to the same embodiment or example of the present disclosure. Furthermore, the particular features, structures, materials, or characteristics may be combined in any suitable manner in one or more embodiments or examples.

According to an aspect of the present disclosure, a middle frame assembly may be provided. The middle frame assembly may include a middle frame including a frame body having a first surface and a second surface opposite to the first surface. The middle frame may define a first through hole penetrating the first surface and the second surface and a bearing plate. The bearing plate may include a bearing body having a third surface and a fourth surface opposite to the third surface and a first extending portion protruding from the third surface and configured to pass through the first through hole fitting with the frame body, such that the bearing body is connected to the frame body and that the first surface and the third surface abut against each other.

In some embodiments, the first extending portion may have an interference fit with the frame body.

In some embodiments, the bearing body may define a second through hole penetrating the third surface and the fourth surface, the middle frame may further include a second extending portion protruding from the first surface and configured to pass through the second through hole and have an interference fit with the bearing body.

In other embodiments, a gap may be defined between the first extending portion and the frame body, a reinforcing medium may be disposed in the gap to connect the first extending portion and the frame body together.

In still other embodiments, a cross section area of the first extending portion may be gradually decreased from the third surface toward a direction away from the fourth surface.

In further other embodiments, the first extending portion may include a side surface connected to the third surface, an angle between the side surface and a flat perpendicular to the third surface may range from 0.5° to 3°.

In some embodiments, a structural intensity of the bearing plate may be greater than a structural intensity of the middle frame.

In other embodiments, both the middle frame and the bearing plate may be plastically deformable.

In still other embodiments, the first extending portion may include an end surface away from the fourth surface, the end surface may be flush with the second surface.

According to another aspect of the present disclosure, a method for manufacturing a middle frame assembly may be provided. The method may include providing a first plate; performing a machining operation on the first plate to form a middle frame including a frame is body, the frame body may have a first surface and a second surface opposite to the first surface and define a first through hole penetrating the first surface and the second surface; providing a second plate; performing a machining operation on the second plate to form a bearing plate including a bearing body and a first extending portion, the bearing body may have a third surface and a fourth surface opposite to the third surface, the first extending portion may protrude from the third surface; inserting the first extending portion into the first through hole; and stamping the frame body such that the first extending portion may fit with the frame body and that the first surface and the third surface may abut against each other.

In some embodiments, the performing a machining operation on the first plate to form a middle frame may further include: machining a second extending portion on the first surface. The performing a machining operation on the second plate to form a bearing plate may further include machining a second through hole penetrating the third surface and the fourth surface. The inserting the first extending portion into the first through hole may further include inserting the second extending portion into the second through hole. The stamping the frame body may further include stamping the bearing body such that the first extending portion has an interference fit with the frame body; and stamping the bearing body such that the second extending portion has an interference fit with the bearing body.

In other embodiments, a gap may be defined between the first extending portion and the frame body. The method may further include welding the first extending portion to the frame body, such that the gap between the first extending portion and the frame body may be filled with a reinforcing medium to connect the first extending portion and the frame body together.

In still other embodiments, the welding the first extending portion to the frame body may further include pushing welding fluid to flow into the gap by blowing, pressurizing, or pumping.

In some embodiments, the frame body may be stamped a plurality of times, strength of an impact force of each stamping may be gradually increased with the increasing of the stamping times.

According to still another aspect of the present disclosure, an electronic apparatus may be provided. The electronic apparatus may include a back shell, a middle frame assembly and a screen. The middle frame assembly may include a middle frame connected to the back shell and comprising a frame body defining a first through hole and a bearing plate including a bearing body and a first extending portion protruding from the bearing body. The first extending portion may be inserted into the first through hole and fitting with the frame body, such that the bearing body is connected to the frame body and that the frame body and the bearing body may abut against each other. The screen may be embedded in the middle frame and covering the bearing plate.

In other embodiments, the first extending portion extending has an interference fit with the frame body. The bearing body may define a second through hole. The middle frame may further include a second extending portion protruding from the frame body, the second extending portion may be inserted into the second through hole and connected to the bearing body by interference fit.

In still other embodiments, a gap may be defined between the first extending portion and the frame body, a reinforcing medium may be filled in the gap to connect the first extending portion and the frame body together.

In further other embodiments, the frame body may include a first surface and a second surface opposite to the first surface, the bearing body may include a third surface and a fourth surface opposite to the third surface, the first surface and the third surface may abut against each other, the first extending portion may protrude from the third surface, a cross section area of the first extending portion may be gradually decreased from the third surface toward a direction away from the fourth surface.

In some embodiments, the first extending portion may include an end surface away from the third surface, the end surface may be flush with the second surface.

In other embodiments, both the middle frame and the bearing plate may be plastically deformable.

In the following, an electronic apparatus 100 provided in embodiments of the present disclosure will be described with reference to drawings.

The electronic apparatus 100 may include intelligent devices such as smartphone, mobile internet device (MID), Ebook, Play Station Portable (PSP), Personal Digital Assistant (PDA) and the like. It should be understood that "electronic apparatus 100" in the present disclosure may include, but be not limited to an apparatus receiving/transmitting communication signals via wired connection, for example, public switched telephone network (PSTN), digital subscriber line (DSL), digital cable, electric cable and/or another data connection/network, and/or cellular network, Wireless Area Networks (WLAN), digital television network such as DVB-H (Digital Video Broadcasting Handheld) network, satellite network, AM-FM broadcast transmitter and/or another communication terminal of wireless interface. The electronic apparatus 100 may also include a satellite or cellular telephone, a personal communication system terminal with cellular radio telephone and data processing, facsimile and data communication, beeper, or other electronic apparatuses with a transceiver.

Figure 1:
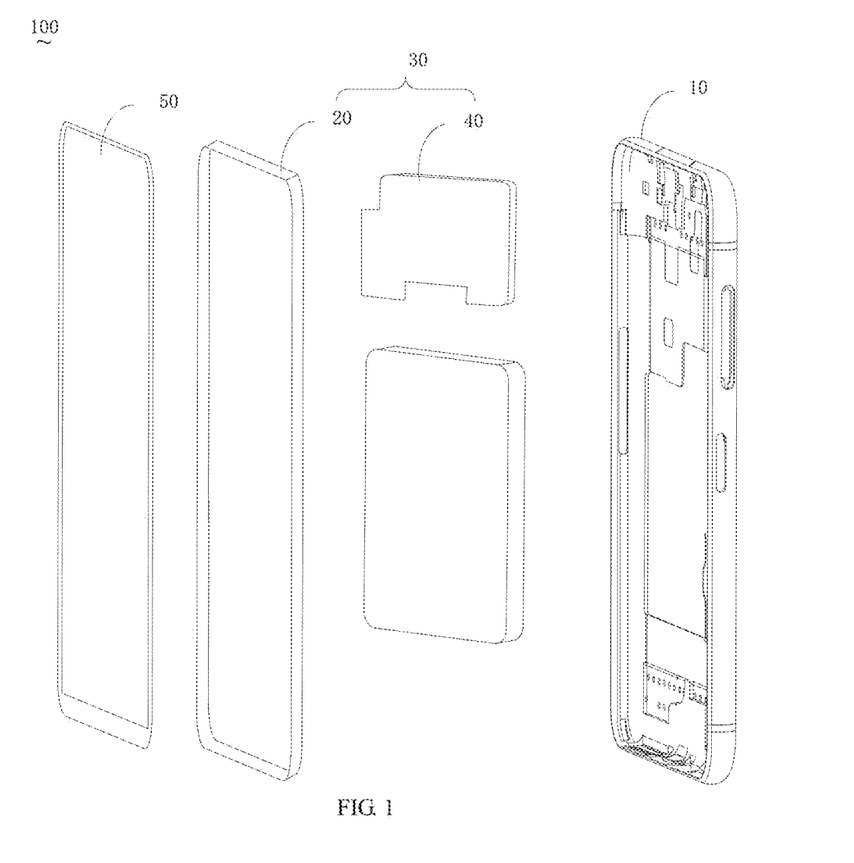
FIG. 1 is an exploded view of the electronic apparatus according to an embodiment of the present disclosure.
Figure 2:
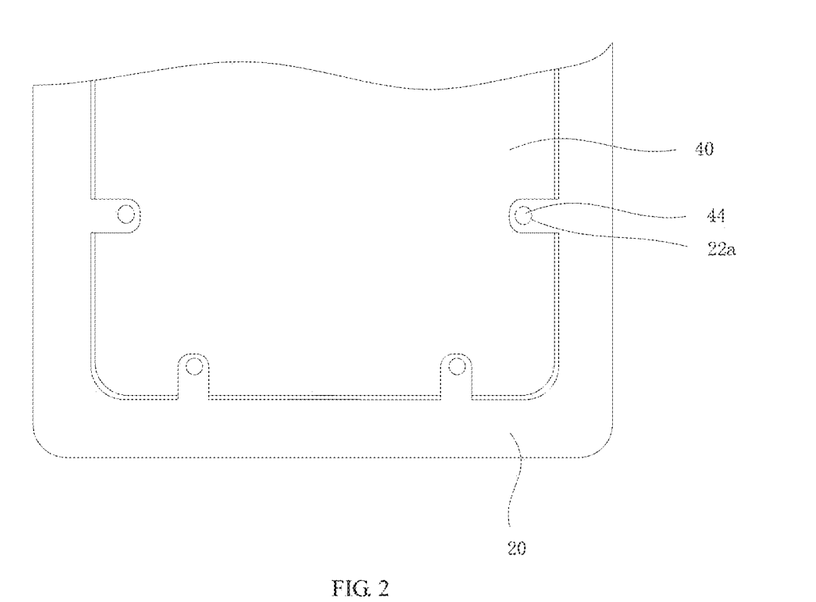
FIG. 2 is a schematic view of part of the electronic apparatus according to an exemplary embodiment of the present disclosure.

Referring to FIGS. 1 and 2, the electronic apparatus 100, according to an embodiment, may include a back shell 10, a middle frame assembly 30 including a middle frame 20 connected to the back shell 10 and a bearing plate 40 connected to the middle frame 20, a screen 50 embedded in the middle frame 20 and covering the bearing plate 40, and electronic components (not shown) arranged between the back shell 10 and the screen 50.

The back shell 10, which may be called as a back cover, may be formed of plastic, glass, ceramics, fiber composites, metal (e.g., stainless steel, aluminum, etc.), other suitable materials, or a combination of these materials. In some embodiments, the back shell 10 may have a rectangular configuration. In other embodiments, the back shell 10 may have other is configurations, such as round, long round and ellipse etc.

Figure 3:
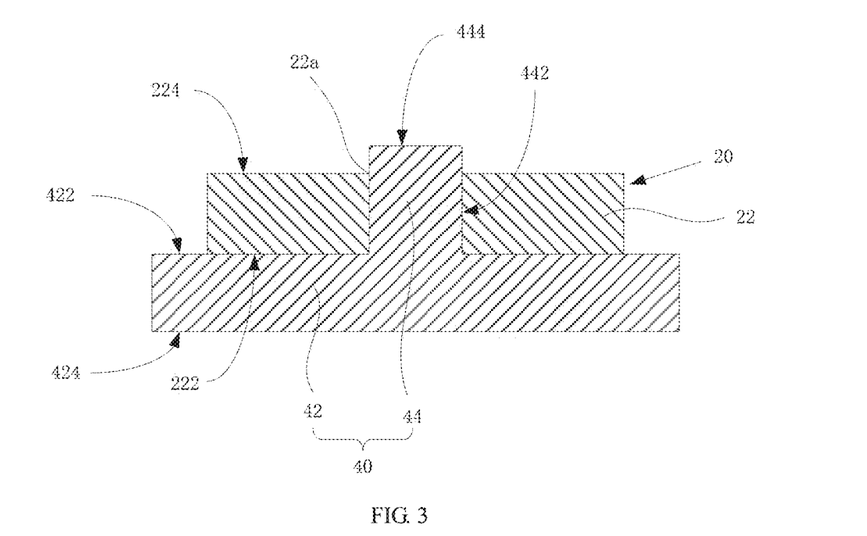
FIG. 3 is partial cross-sectional view of a middle frame assembly according to a an embodiment of the present disclosure.

Referring to FIG. 3 and combining with FIG. 2, the middle frame 20 may include a frame body 22 having a first surface 222 and a second surface 224 opposite to the first surface 222. The frame body 22 may define a first through hole 22a penetrating the first surface 222 and the second surface 224. In some embodiments, the frame body 22 may also have a rectangular configuration and surround the back shell 10. In other embodiments, the frame body 22 may have other configurations similar to that of the back shell 10. The middle frame 20 may be formed of metal, such as stainless steel, aluminum, or other suitable materials, which is not limited herein. In some embodiments, the middle frame 20 may be a frame outside the electronic apparatus.

The bearing plate 40 may be a circuit board. The electronic components of the electronic apparatus 100 may be arranged on the bearing plate 40. The bearing plate 40 may include a bearing body 42 and a first extending portion 44. The bearing body 42 may include a third surface 422 and a fourth surface 424 opposite to the third surface 422. The first extending portion 44 may protrude from the third surface 422 and toward a direction away from the fourth surface 424. In some embodiments, the first extending portion 44 may include a side surface 442 connected to the third surface 422 and an end surface 444 away from the fourth surface 424.

In some embodiments, the bearing plate 40 may have a one-piece structure, that is, the bearing body 42 and the first extending portion 44 may be formed of a single piece. In this condition, the bearing body 42 and the first extending portion 44 may be formed by Computer Numerical Control (CNC) machining or through stamping in a same process, which could reduce cost and shorten a processing period, thereby improving an efficiency of product development.

In other embodiments, the bearing body 42 and the first extending portion 44 may be two independent structures. The bearing body 42 and the first extending portion 44 may be fixed together to form the bearing plate 40 by welding or other manners, which is not limited herein. Since the bearing body 42 and the first extending portion 44 are two independent structures, different processing technologies may be used to form the bearing body 42 and the first extending portion 44. For instance, since a precision requirement of the bearing body 42 may be relatively low, the bearing body 42 may be formed through stamping. While a precision requirement of the first extending portion 44 may be relatively high, the first extending portion 44 may be formed through CNC machining. Therefore, the bearing body 42 and the first extending portion 44 could be formed through different processing technologies according to different precision requirements, which could facilitate reducing cost and shortening processing period, thereby improving an efficiency of product development.

The first extending portion 44 may pass through the first through hole 22a and fit with the frame body 100. The first surface 222 and the third surface 422 may abut against each other. Therefore, the middle frame 20 and the bearing plate 40 may be connected together firmly.

In some embodiments, the first extending portion 44 may have an interference fit with the frame body 100. The "interference fit" is a fastening between two parts which is achieved by friction after the parts are pushed together, rather than by any other means of fastening. In these embodiments, the first extending portion 44 may be inserted into the first through hole 22a, at least part of the first extending portion 44 in the first through hole 22a may have a cross section area slightly larger than that of the first through hole 22a, such that the friction between the first extending portion 44 and the frame body 22 could be large enough to hold the first extending portion 44 in the first through hole. Therefore, the middle frame 20 and the bearing plate 40 could be connected together as a whole tightly.

In addition, the first surface 222 and the third surface 422 may abut against each other, that is, first surface 222 may contact with the third surface 422 closely, such that space occupied by the whole of the middle frame assembly 30 could be reduced. Therefore, volume of the electronic apparatus could be reduced.

In some embodiments, a number of the first through hole 22a may be one or more, which is not limited herein. A number of the first extending portion 44 may be equal to that of the first through hole 22a. Each first extending portion 44 may pass through a corresponding first through hole 22a.

In some embodiments, a peripheral contour of the first extending portion 44 may have a circular shape, a square shape, or other irregular shapes. An inner contour of the first through hole 22a may match with the peripheral contour of the first extending portion 44.

In some embodiments, a structural intensity of the bearing plate 40 may be greater than a structural intensity of middle frame 20.

The "structural intensity" is a bearing capacity of the bearing plate 40 or the middle frame 20 when subjected to both static and dynamic loads. In some embodiments, since the bearing plate 40 may be mainly configured to bear electronic components of the electronic apparatus 100, the bearing plate 40 may be required to bear a larger load, and the bearing plate 40 may be required to have a great structural intensity. While the middle frame 20 may not be used to bearing other components of the electronic apparatus 100, a smaller structural intensity relative to that of the bearing plate 40 may be enough for the middle frame 20.

In some embodiments, both the frame body 22 and the bearing body 42 may be capable of plastic deformation.

The "plastic deformation" is an irreversible deformation, for example, "plastic deformation" may be a physical phenomenon that an object (including fluids and solids) is deformed when subjected to an external force under certain conditions and cannot return to its original state after the external force is removed or disappeared. Since both the middle frame 20 and the bearing plate 40 could be plastically deformed, both the middle frame 20 and the bearing plate 40 could be formed through stamping process. Therefore, mass production could be realized, a product development period could be greatly shortened and cost could be reduced.

The screen 50, according to an embodiment, may be substantially parallel to the back shell 10. The screen 50 may include pixels formed from light-emitting diodes (LEDs), organic LEDs (OLEDs), plasma cells, electrowetting pixels, electrophoretic pixels, liquid crystal display (LCD) components, or other suitable pixel structures. A screen cover layer such as a layer of clear glass or plastic may cover the surface of the screen 50 or the outermost layer of the screen 50 may be formed from a color filter layer, thin-film transistor layer, or other display layer. In this embodiment, the screen 50 may further incorporate touch electrodes and be used as a touch screen for inputting information.

Figure 4:
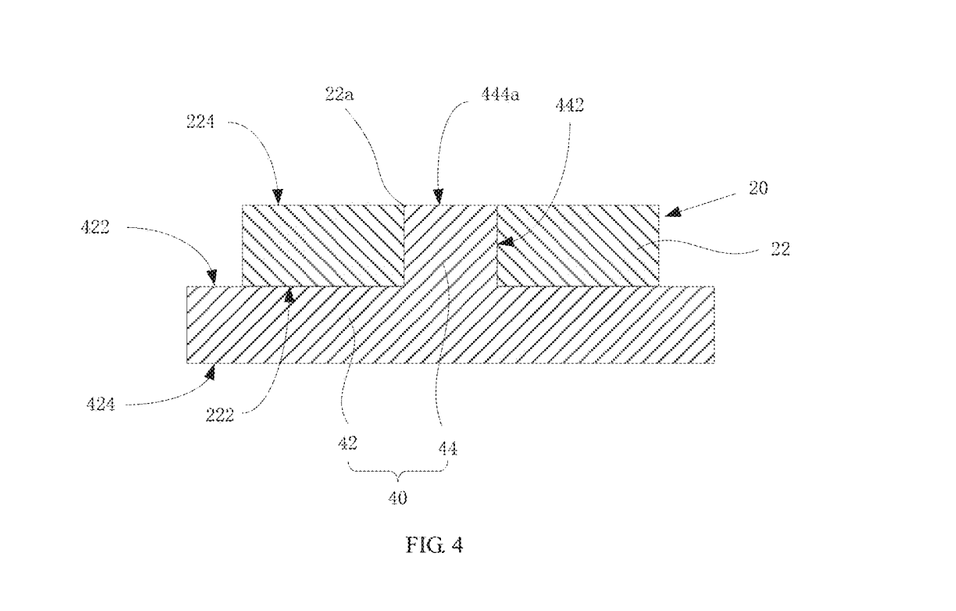
FIG. 4 is a partial cross-sectional view of a middle frame assembly according to another embodiment of the present disclosure.

In some embodiments, referring to FIG. 4, the end surface 444a of the first extending portion 44 may be flush with the second surface 224, therefore, the space occupied by the middle frame assembly 30 could be further reduced. As a result, application scenarios of the middle frame assembly 30 can be expanded.

Figure 5:
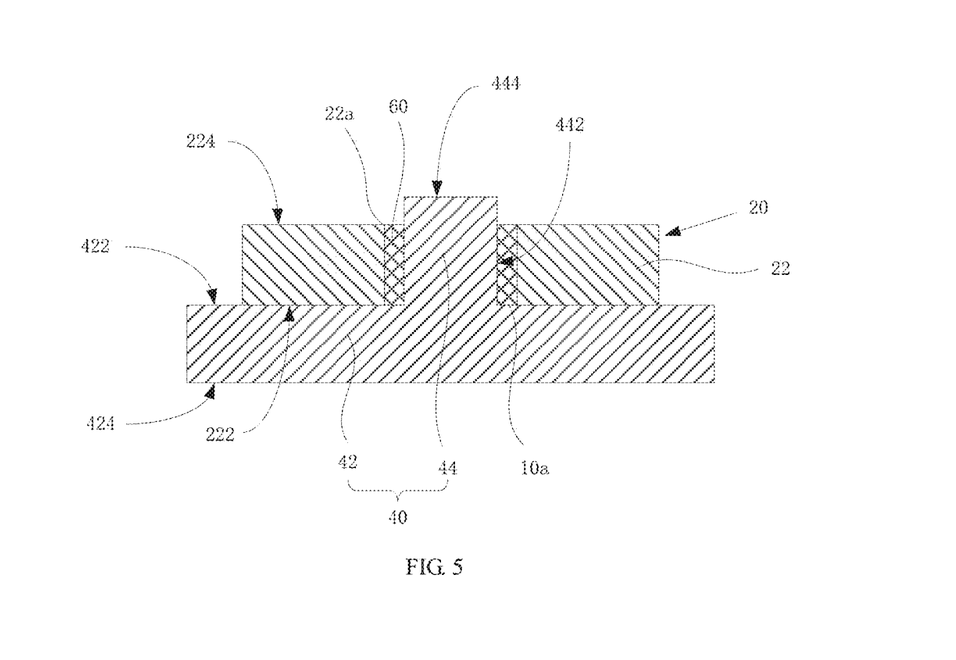
FIG. 5 is a partial cross-sectional view a middle frame assembly according to a still another embodiment of the present disclosure.

In still another embodiment, referring to FIG. 5, the middle frame assembly 30 may be similar to that of the above embodiment, except that a gap 10a may be defined between the first extending portion 44 and the frame body 22, a reinforcing medium 60 may be disposed in the gap 10a to connect the extending portion 220 and the frame body 22 together. In FIG. 5, a size of the gap 10a may be enlarged for the sake of clarity. In some embodiments, the reinforcing medium 60 may be formed by welding fluid after being cooled in a welding process. In other embodiments, the reinforcing medium 60 may also be formed by liquid colloid after being cooled. It could be understood that the reinforcing medium 60 may also be other solid filling media in other embodiments.

Figure 6:
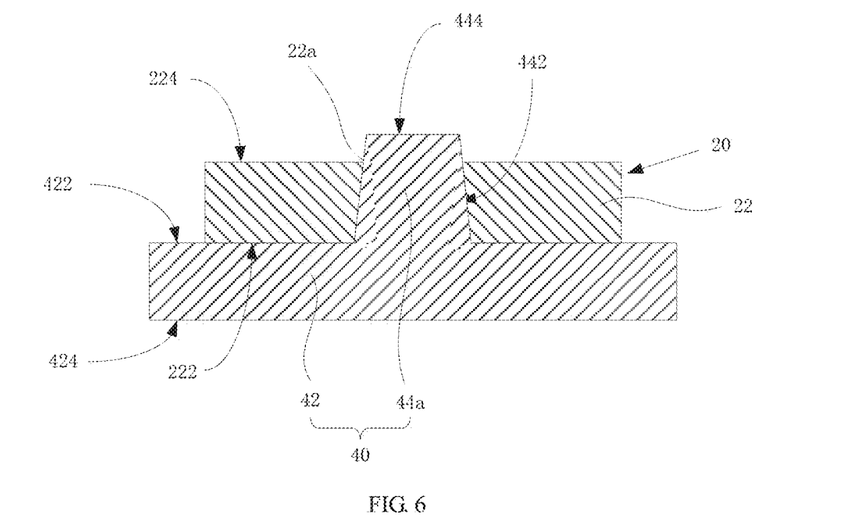
FIG. 6 is a partial cross-sectional view a middle frame assembly according to a further another embodiment of the present disclosure.

In further another embodiment, referring to FIG. 6, the middle frame assembly 30 may be similar to that of the above embodiment, except that a cross section area of the first extending portion 44a may be gradually decreased from the third surface 422 toward a direction away from the fourth surface 424.

Specifically, when the first extending portion 44a is formed by a stamping mould, in order to separate the bearing plate 40 from the mould, a draft angle α may be generally formed. In some embodiments, the draft angle α may be an angle between the side surface 220 and a flat perpendicular to the third surface 422. The draft angle α may be different for the moulds of different materials. For wood mold, the draft angle α may be generally 1°~3°. For metal mold, the draft angle α may be generally 0.5°~2°. It is necessary to select an appropriate draft angle α, for example, an overlarge draft angle α may tend to result in that the bearing plate 40 may not have enough regidity, and if a draft angle α is too small, a demolding of the bearing plate 40 may be difficult. In the present disclosure, the material of the bearing plate 40 may be an alloy material. In some embodiments, the assembled middle frame 20 and the bearing plate 40 may need to be welded together, since a variation range of the stiffness of the alloy material is wide, there is no need to worry about the problem that the rigidity of the bearing board 200 cannot be guaranteed. Therefore, in an embodiment, the draft angle α of the present disclosure may range from 0.5° to 3°. On one hand, the rigidity requirement of the bearing plate 40 could be satisfied, and on the other hand, the demolding of the bearing plate 40 may be easier.

Figure 7:
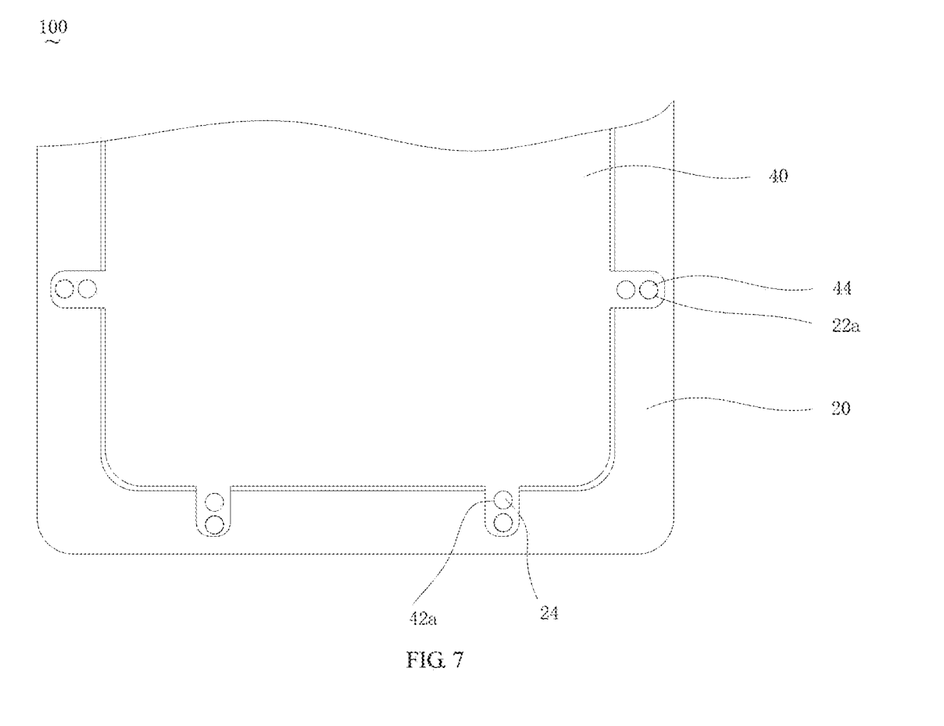
FIG. 7 is a schematic view of part of the electronic apparatus according to another exemplary embodiment of the present disclosure.
Figure 8:
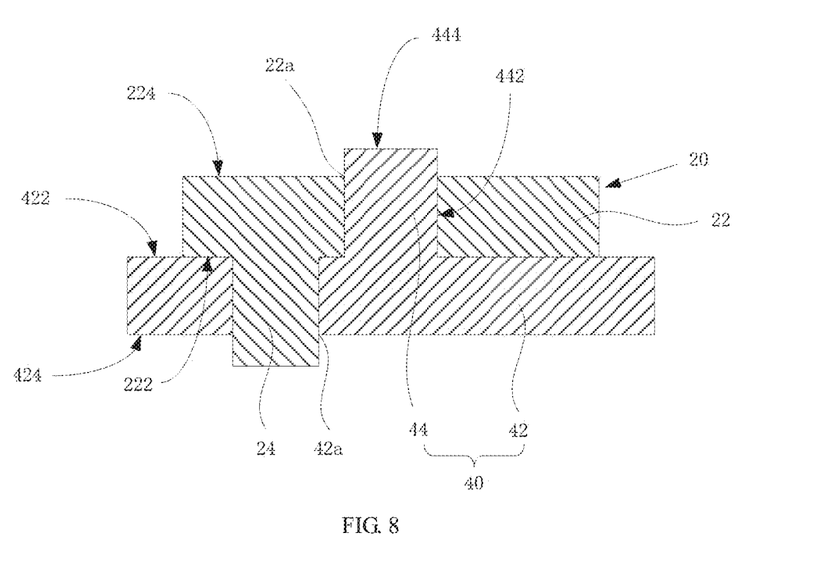
FIG. 8 is a partial cross-sectional view of a middle frame assembly according to another embodiment of the present disclosure.

In another embodiment, referring to FIGS. 7 and 8, the middle frame assembly 30 may be similar to that of the above embodiment, except that the frame body 22 may further include a second extending portion 24 protruding from the first surface 222, and that the bearing body 42 may further define a second through hole 42a penetrating the third surface 422 and the fourth surface 424. The second extending portion 24 may be inserted into the second through hole 42a and have an interference fit with the frame body 22, such that the middle frame 20 and the bearing plate 40 may be connected more firmly.

Figure 9:
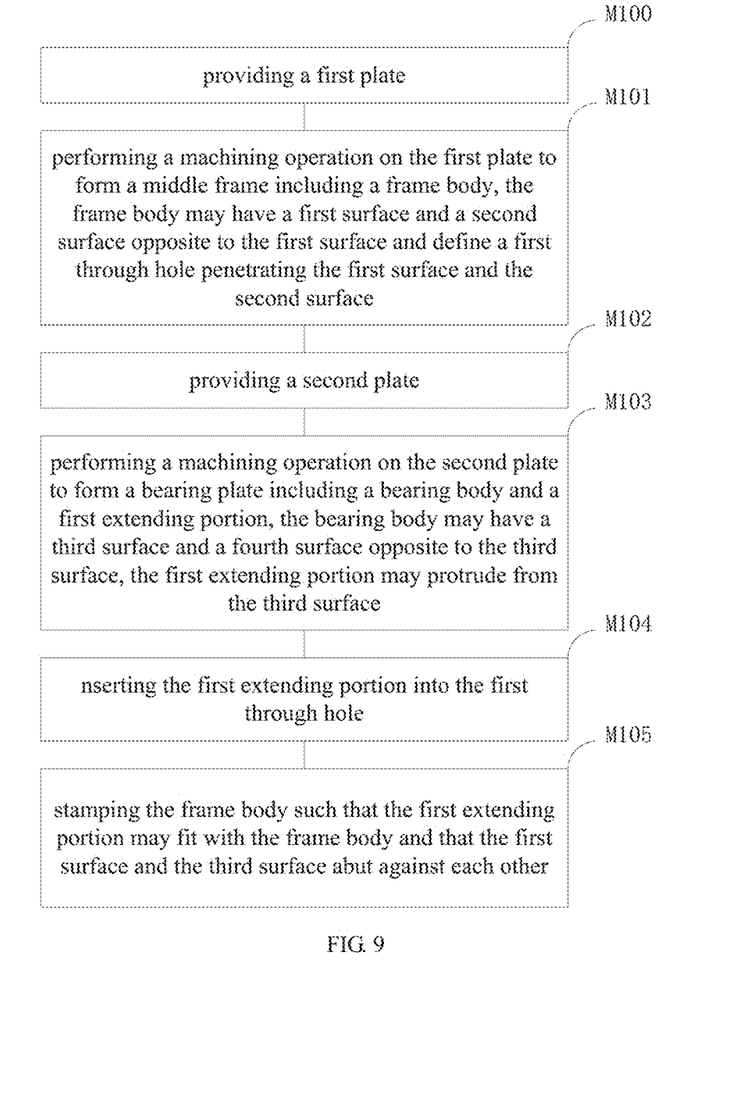
FIG. 9 is a flow chart of a method for manufacturing a middle frame assembly according to an embodiment of the present disclosure.

Referring to FIG. 9 and combining with FIGS. 3 and 4, a flow chart diagram of a method for manufacturing a middle frame assembly according to an embodiment of the present application is depicted. The method may include:

M100, providing a first plate.

M101, performing a machining operation on the first plate to form a middle frame including a frame body, the frame body may have a first surface and a second surface opposite to the first surface and define a first through hole penetrating the first surface and the second surface.

At block M101, the middle frame 20 may be formed through a stamping processing, a CNC machining, or a combination of the stamping processing and the CNC machining. If a precision requirement of the middle frame 20 is not high, the stamping processing may be enough. If the precision requirement of the middle frame 20 is high, the CNC machining may be necessary. In other embodiments, the CNC machining may be adopted to process on an outer surface of the middle frame 20, while the stamping may be adopted to process on an internal surface of the middle frame, so as to realize that different surfaces with different precision requirements could be processed through different processing methods, thereby realizing flexible processing, which could shorten the processing period and reduce cost.

M102, providing a second plate.

M103, performing a machining operation on the second plate to form a bearing plate including a bearing body and a first extending portion, the bearing body may have a third surface and a fourth surface opposite to the third surface, the first extending portion may protrude from the third surface.

Similarly, at block M103, the carrier plate 200 may be obtained through stamping processing, CNC machining, or a combination of the stamping and the CNC machining.

M104, inserting the first extending portion into the first through hole.

M105, stamping the frame body such that the first extending portion may fit with the frame body and that the first surface and the third surface abut against each other.

Figure 10:
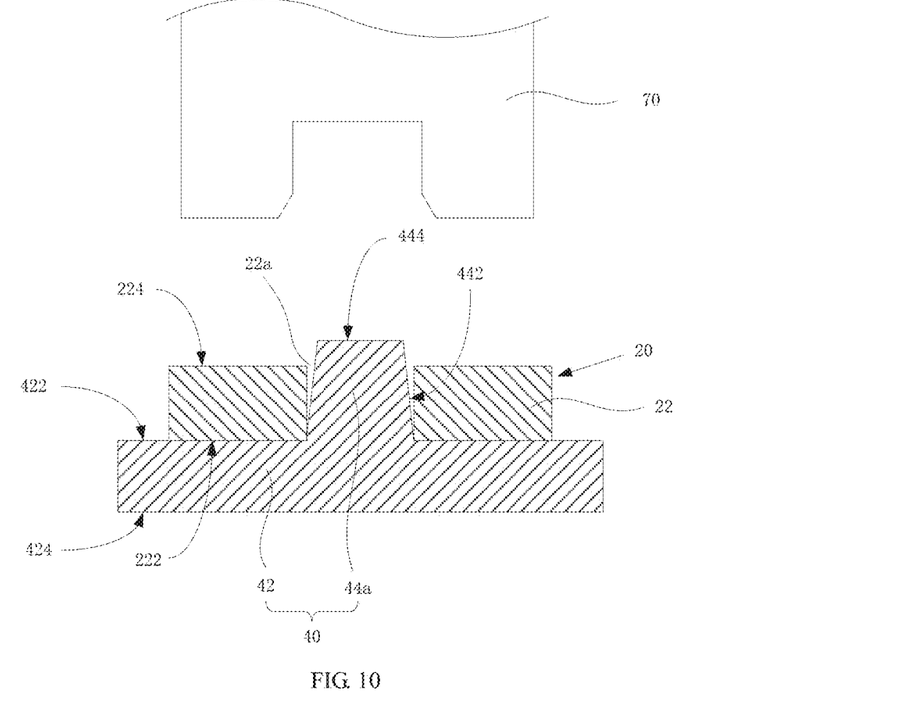
FIG. 10 is an isometric view of the middle frame assembly before being stamped according to an embodiment of the present disclosure.
Figure 11:
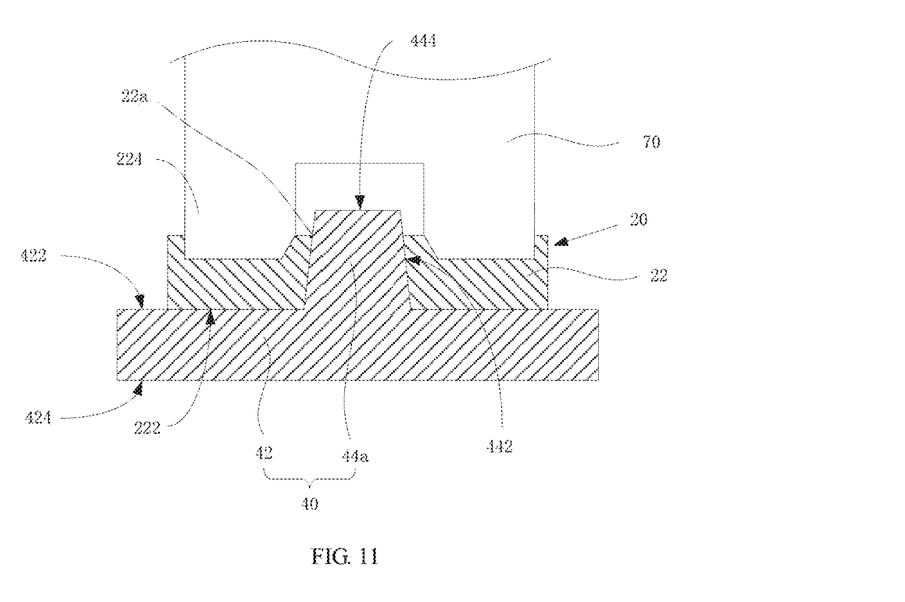
FIG. 11 is an isometric view of the middle frame assembly when being stamped according to an embodiment of the present disclosure.
Figure 12:
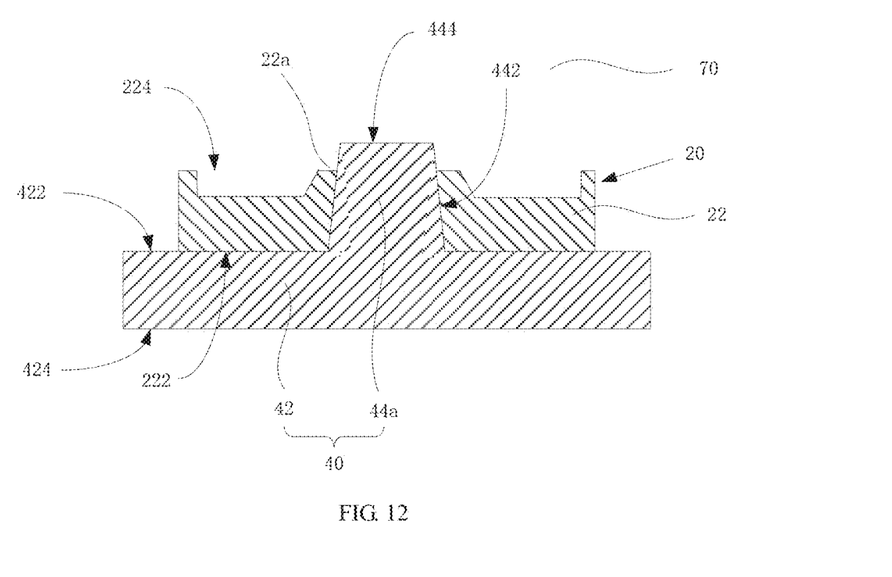
FIG. 12 is an isometric view of the middle frame assembly after being stamped according to an embodiment of the present disclosure.

At block M105, the frame body 22 may be stamped by a stamping punch 70 of a stamping die, such that the frame body 22 may be plastically deformed (shown in FIGS. 10 to 11). After the frame body 22 is stamped, the frame body 22 is deformed, the first extending portion 44 may have an interference fit with the frame body 22, and the first surface 222 and the third surface 422 may abut against each other (shown in FIG. 12).

In some embodiments, the frame body 22 may be stamped a plurality of times with different impact force. The different impact force may be gradually increased with the increasing of the stamping times.

For example, the frame body 22 may be stamped n times, and the impact force of the $n^{th}$ stamping may be defined as Fn, then Fn>Fn−1> . . . >F1 may be satisfied, n may be an integer greater than or equal to 2. When the frame body 22 is stamped in this way, the Fn−1 corresponding to the n−1$^{th}$ stamping may smaller than the Fn corresponding to the n$^{th}$ stamping, and plasticity of the frame body 22 could be improved. In other words, strength of the impact force of a stamping may be greater than the strength of the impact force of a last stamping, which could improve plasticity of the frame body 22, increase flexibilities of the frame body 22, and improve the metal cutting performance of the frame body 22.

The frame body 22 may be stamped a plurality of times in order to change metal properties of the frame body 22, change the crystal phase structure of metal structures, and obtain more excellent mechanical properties.

Figure 13:
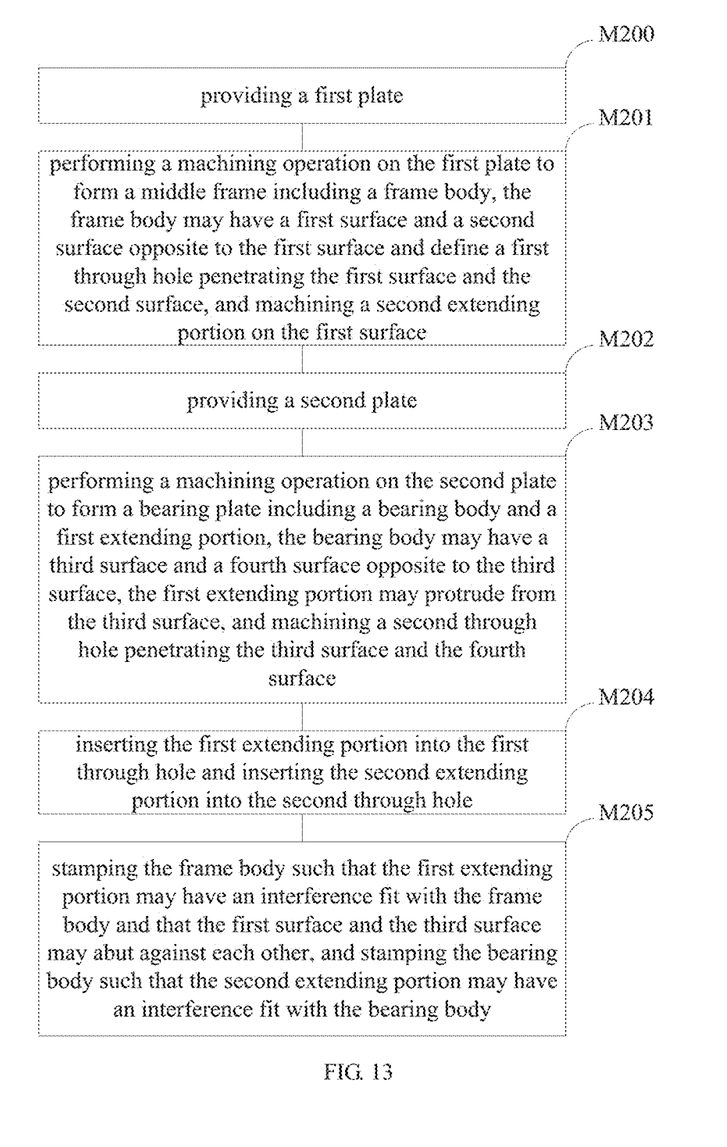
FIG. 13 is a flow chart of a method for manufacturing a middle frame assembly according to another embodiment of the present disclosure.

Referring to FIG. 13 and combining with FIG. 8, a flow chart diagram of a method for manufacturing a middle frame assembly according to another embodiment of the present application is depicted. The method may include:

M200, providing a first plate.

M201, performing a machining operation on the first plate to form a middle frame including a frame body, the frame body may have a first surface and a second surface opposite to the first surface and define a first through hole penetrating the first surface and the second surface, and machining a second extending portion on the first surface.

Specifically, at block M201, the second extending portion 24 may be welded to the first surface 222 in some embodiments. In other embodiments, the second extending portion 24 and the frame body 22 may be formed of a single piece.

M202, providing a second plate.

M203, performing a machining operation on the second plate to form a bearing plate including a bearing body and a first extending portion, the bearing body may have a third surface and a fourth surface opposite to the third surface, the first extending portion may protrude from the third surface, and machining a second through hole penetrating the third surface and the fourth surface.

Specifically, the second through hole 42a may be formed through CNC machining or drilling processing. When a precision requirement of the second through hole 42a is high, the CNC machining may be necessary. When the precision requirement of the second through hole 42a is not high, the drilling processing may be enough. In addition, in order to make the second extending portion 24 pass through the second through hole 42a smoothly, scraping or polishing the outer surface of the second extending portion 24 may be necessary to obtain a relatively smooth outer surface. In an embodiment, a roughness of the outer surface of the second extending portion 24 may be smaller than a roughness of the bearing body 42. An inner surface of the second through hole 42a may need to be scraped or polished to be relatively smooth, thereby the second extending portion 24 could pass through the second through hole 42a smoothly, which may shorten a processing time and improve a production efficiency of the middle frame assembly.

M204, inserting the first extending portion into the first through hole and inserting the second extending portion into the second through hole.

M205, stamping the frame body such that the first extending portion may have an interference fit with the frame body and that the first surface and the third surface may abut against each other, and stamping the bearing body such that the second extending portion may have an interference fit with the bearing body.

Specifically, at block M205, the bearing body 42 may also be stamped, such that the bearing body 42 may be plastically deformed, and the second extending portion 24 may have an interference fit with the bearing body 110. The frame body 22 and the bearing body 42 may be connected by the interference fit between the first extending portion 44 and the frame body 22, and the interference fit between the second extending portion 24 and the bearing body 42, which could make the structure of the middle frame assembly more stable.

Figure 14:
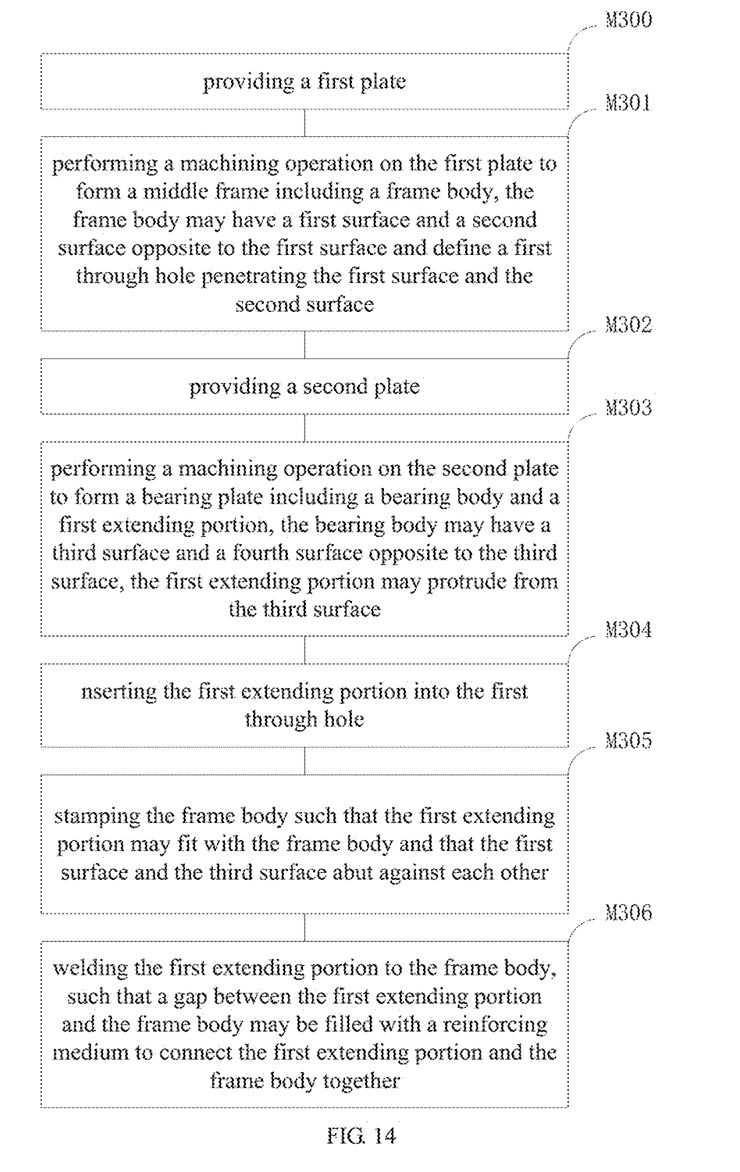
FIG. 14 is a flow chart of a method for manufacturing a middle frame assembly according to still another embodiment of the present disclosure.

Referring to FIG. 14 and combining with FIG. 5, a flow chart diagram of a method for manufacturing a middle frame assembly according to still another embodiment of the present application is depicted. The method may include:

M300, providing a first plate.

M301, performing a machining operation on the first plate to form a middle frame including a frame body, the frame body may have a first surface and a second surface opposite to the first surface and define a first through hole penetrating the first surface and the second surface.

M302, providing a second plate.

M303, performing a machining operation on the second plate to form a bearing plate including a bearing body and a first extending portion, the bearing body may have a third surface and a fourth surface opposite to the third surface, the first extending portion may protrude from the third surface.

M304, inserting the first extending portion into the first through hole.

M305, stamping the frame body such that the first extending portion may fit with the frame body and that the first surface and the third surface may abut against each other.

M306, welding the first extending portion to the frame body, such that a gap between the first extending portion and the frame body may be filled with a reinforcing medium to connect the first extending portion and the frame body together.

At block M306, during welding the first extending portion 22 to the frame body 22, welding fluid may flow into the gap 10a and form the reinforcing medium 60 when being cooled.

In some embodiments, during welding the first extending portion 22 to the frame body 22, the welding fluid formed after welding may be blown from the second surface 224, such that the welding fluid is pushed to flow, and that the welding fluid could flow into the gap 10a quickly, and that the cooled welding fluid could connect the first extension 220 and the frame body 22 more firmly. In some embodiments, the blowing device for blowing the welding fluid may be a blower, a high pressure nozzle, an air gun, or the like.

In addition, it should be noted that a number of the blowing device may be one or more, which is not limited herein. Specifically, the number of the blowing device may be determined according to the welding effect of the first extending portion 44 and the frame body 22.

In addition, times of the blowing the welding fluid may be one or more, which is not limited herein. Specifically, times of the blowing the welding fluid may be determined according to the welding, effect of the gap 10a. When the first extension portion 220 and the frame body 22 are welded together, the welding fluid filled in the gap 10a may be blown, which could facilitate the flowing of the welding fluid, such that the bubbles in the welding fluid filled in the gap 10a could be discharged. Therefore, connecting strength between the first extending portion 44 and the frame body 22 could be enhanced.

In addition, a direction of blowing the welding fluid could be changed. The direction of blowing the welding fluid may be substantially perpendicular to the second surface 224 of the frame body 22, or substantially parallel to the second surface 224, or at a certain angle with the second surface 224. For example, if the gap 10a extends in a certain direction, the welding fluid may be blown along the extending direction of the gap 10a, such that the welding fluid could flow along the extending direction of the gap 10a. Therefore, the welding fluid could fill the gap 100 rapidly. In addition, it could facilitate the discharging of the bubbles in the welding fluid to blow the welding fluid, reduce the pores, and reduce the influence on the strength and appearance quality of the welding, such that the welding connection between the first extending portion 44 and the frame bogy 110 could be more firmly.

In other embodiments, the welding fluid may be pushed to flow into the gap 10a by pressurizing, or pumping, the details may be similar to that of the blowing, which are not recited herein.

For one skilled in the art, it is clear that the present application is not limited to the details of the above exemplary embodiments, and that the present application can be implemented in other specific forms without deviating from the spirit or basic characteristics of the application. Therefore, at any point, the embodiments should be regarded as exemplary and unrestrictive, and the scope of the present application is defined by the appended claims, rather than the above description. Therefore, all changes within the meaning and scope of the equivalent elements of the claim are intended to be included. Any appended label recited in the claims shall not be regarded as a limitation to the claims. In addition, apparently, the terms "include", "comprise" and the like do not exclude other units or steps, and the singular does not exclude plural.

It should be noted that, the foregoing disclosed is merely exemplary implementations and it is not intended to limit the scope of the present disclosure. Although the present disclosure is described in details with reference to the above embodiments, however, one skilled in the art may make any modification or equivalence based on the technical solution and the inventive concept of the present disclosure. All these modifications and equivalences shall all be covered within the protection claimed in the claims of the present disclosure.

What is claimed is:

1. A middle frame assembly, comprising
a middle frame, comprising a frame body having a first surface and a second surface opposite to the first surface, wherein the frame body defines a first through hole penetrating the first surface and the second surface; and
a bearing plate, comprising:
    a bearing body having a third surface and a fourth surface opposite to the third surface; and
    a first extending portion protruding from the third surface and configured to pass through the first through hole and fitting with the frame body, such that the bearing body is connected to the frame body and that the first surface and the third surface abut against each other;
    wherein a gap is defined between the first extending portion and the frame body, a reinforcing medium is disposed in the gap to connect the first extending portion and the frame body together;
    wherein a cross section area of the first extending portion is gradually decreased from the third surface toward a direction away from the fourth surface; the first extending portion comprises a side surface connected to the third surface, an angle between the side surface and a flat perpendicular to the third surface ranges from 0.5° to 3°.

2. The middle frame assembly according to claim 1, wherein the first extending portion has an interference fit with the frame body.

3. The middle frame assembly according to claim 1, wherein the bearing body defines a second through hole penetrating the third surface and the fourth surface;
the middle frame further comprises a second extending portion protruding from the first surface and configured to pass through the second through hole and have an interference fit with the bearing body.

4. The middle frame assembly according to claim 1, wherein a structural intensity of the bearing plate is greater than a structural intensity of the middle frame.

5. The middle frame assembly according to claim 1, wherein both the middle frame and the bearing plate are plastically deformable.

6. The middle frame assembly according to claim 1, wherein the first extending portion comprises an end surface away from the fourth surface, the end surface is flush with the second surface.

7. A method for manufacturing a middle frame assembly, comprising:
providing a first plate;
performing a machining operation on the first plate to form a middle frame comprising a frame body, wherein the frame body has a first surface and a second surface opposite to the first surface and defines a first through hole penetrating the first surface and the second surface;
providing a second plate;
performing a machining operation on the second plate to form a bearing plate comprising a bearing body and a first extending portion, wherein the bearing body has a third surface and a fourth surface opposite to the third surface, the first extending portion protrudes from the third surface;
inserting the first extending portion into the first through hole; and
stamping the frame body such that the first extending portion fits with the frame body and that the first surface and the third surface abut against each other;
wherein a gap is defined between the first extending portion and the frame body, the method further comprises:
welding the first extending portion to the frame body, such that the gap between the first extending portion and the frame body is filled with a reinforcing medium to connect the first extending portion and the frame body together.

8. The method according to claim 7, wherein the performing a machining operation on the first plate to form a middle frame further comprises:
machining a second extending portion on the first surface;
the performing a machining operation on the second plate to form a bearing plate further comprises:
machining a second through hole penetrating the third surface and the fourth surface;
the inserting the first extending portion into the first through hole further comprises:
inserting the second extending portion into the second through hole; and
the stamping the frame body further comprises:
stamping the frame body such that the first extending portion has an interference fit with the frame body; and
stamping the bearing body such that the second extending portion has an interference fit with the bearing body.

9. The method according to claim 7, wherein the welding the first extending portion to the frame body further comprises:

pushing welding fluid to flow into the gap by blowing, pressurizing, or pumping.

10. The method according to claim 7, wherein the frame body is stamped a plurality of times, strength of an impact force of each stamping is gradually increased with the increasing of the stamping times.

11. An electronic apparatus, comprising:
a back shell;
a middle frame assembly, comprising:
  a middle frame, connected to the back shell and comprising a frame body defining a first through hole; and
  a bearing plate, comprising:
    a bearing body, and
    a first extending portion protruding from the bearing body, wherein the first extending portion is inserted into the first through hole and fitting with the frame body, such that the bearing body is connected to the frame body and that the frame body and the bearing body abut against each other; and
a screen, embedded in the middle frame and covering the bearing plate;
wherein the frame body comprises a first surface and a second surface opposite to the first surface;
the bearing body comprises a third surface and a fourth surface opposite to the third surface, the first surface and the third surface abut against each other;
the first extending portion protrudes from the third surface, a cross section area of the first extending portion is gradually decreased from the third surface toward a direction away from the fourth surface.

12. The electronic apparatus according to claim 11, wherein the first extending portion extending has an interference fit with the frame body;
the bearing body defines a second through hole;
the middle frame further comprises a second extending portion protruding from the frame body, wherein the second extending portion is inserted into the second through hole and connected to the bearing body by interference fit.

13. The electronic apparatus according to claim 11, wherein a gap is defined between the first extending portion and the frame body, a reinforcing medium is filled in the gap to connect the first extending portion and the frame body together.

14. The electronic apparatus according to claim 11, wherein the first extending portion comprises an end surface away from the third surface, the end surface is flush with the second surface.

15. The middle frame assembly according to claim 12, wherein both the middle frame and the bearing plate are plastically deformable.

* * * * *